United States Patent
Tung et al.

(10) Patent No.: US 9,621,158 B2
(45) Date of Patent: Apr. 11, 2017

(54) SWITCH AND MULTIPLEXER INCLUDING THE SAME

(71) Applicant: REALTEK SEMICONDUCTOR CORP., Hsinchu (TW)

(72) Inventors: Ming-Hui Tung, Hsinchu (TW); An-Ming Lee, Baoshan Township, Hsinchu County (TW); Leaf Chen, Hsinchu (TW); Chien-Wen Chen, Toufen Township, Miaoli County (TW); Guan-Yu Chen, Taichung (TW); Tsung-Yen Liu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/867,608

(22) Filed: Sep. 28, 2015

(65) Prior Publication Data

US 2016/0301410 A1    Oct. 13, 2016

(30) Foreign Application Priority Data

Apr. 13, 2015    (TW) .............................. 104111748 A

(51) Int. Cl.
*H03K 17/00*    (2006.01)
*H03K 17/693*   (2006.01)

(52) U.S. Cl.
CPC .................................. *H03K 17/693* (2013.01)

(58) Field of Classification Search
CPC . H03F 3/45179; H03F 1/086; H01L 27/1203; H01L 27/027; H01L 27/0288; H03K 17/693; H03K 17/005; H03K 17/162
USPC ....... 327/408, 407, 403–405, 427, 434, 437, 327/382–386, 379; 326/113
See application file for complete search history.

(56) References Cited

U.S. PATENT DOCUMENTS

2014/0009214 A1*  1/2014  Altunkilic ............ H03K 17/161
                                                      327/427

* cited by examiner

*Primary Examiner* — Lincoln Donovan
*Assistant Examiner* — Thomas Skibinski
(74) *Attorney, Agent, or Firm* — Muncy, Geissler, Olds & Lowe, P.C.

(57) ABSTRACT

A switch and a multiplexer including the same are provided, which are applicable to selectively transmit the high frequency signal from an input terminal to an output terminal therethrough. The switch includes a switch device and a variable resistor. The switch device is connected between the input terminal and the output terminal, and the switch device includes a control terminal and is configured to be switched between ON and OFF according to a switch controlling signal provided to the control terminal. The variable resistor is connected to the control terminal and configured to change to a first resistance while the switch device is ON, and to change to a second resistance while the switch device is OFF according to a resistor controlling signal. The first resistance is higher than the second resistance, and the resistor controlling signal is changed corresponding to the switch controlling signal.

16 Claims, 7 Drawing Sheets

SWITCH AND MULTIPLEXER INCLUDING THE SAME

CROSS-REFERENCE TO RELATED APPLICATION

This application claims priority to Taiwan Patent Application No. 104111748, filed on Apr. 13, 2015, in the Taiwan Intellectual Property Office, the disclosure of which is incorporated herein in its entirety by reference.

BACKGROUND OF THE INVENTION

1. Field of the Invention

The present invention relates in general to a switch and a multiplexer including the same, and more particularly to a switch and a multiplexer including the same in which the variable resistor is disposed to reduce the signal interference and loss.

2. Description of the Related Art

A multiplexer is utilized for selecting one of multiple input signals as an output signal, and is extensively applied in various fields. For example, in a modern electronic system, multiple parallel signals are converted to a serial signal to reduce hardware cost for signal transmission. When the multiple parallel signals are converted to the serial signal, a multiplexer cyclically is utilized to select the parallel signals one after another, so that data corresponding to individual parallel signals becomes a serial arrangement in the serial signal outputted by the multiplexer.

When the conventional multiplexers are applied to the high-speed transmission applications, it is desired that the signal should completely pass through the transmission gate without signal losses and interferences. As shown in FIG. 1A, the parasitic capacitance usually exists in a multiplexer 1, which is caused by the capacitance produces by the adjacent electronic components or the circuit modules in the circuit. Such capacitance may affect the optimal efficiencies of the multiplexers, and especially, when it is produced in the high frequency signal.

The multiplexer may be composed of a plurality of switches, and the switches are disposed in serial along the path for conducting between a first input terminal In1 and a second input terminal In2 and an output terminal Out in the conventional multiplexer. However, as shown in FIG. 1B, the signal may be attenuated and interfered by the parasitic capacitance of the switch, and the unnecessary signal losses and interferences may be inevitably caused in the practical circuit, and hence the signal attenuation and distortion are caused by the parasitic capacitance effect. As a result, a switch and a multiplexer including the same which are able to reduce the signal attenuation and interferences are needed.

SUMMARY OF THE INVENTION

For the sake of resolving the aforementioned technical problems, one aspect of the present provides a switch which is applicable to transmit the high frequency signal from an input terminal to an output terminal therethrough. The switch includes a switch device and a variable resistor. The switch device is connected between the input terminal and the output terminal, and the switch device includes a control terminal and is configured to be switched between ON and OFF according to a switch controlling signal provided to the control terminal. The variable resistor is connected to the control terminal and configured to be changed to a first resistance while the switch device is ON, and to be changed to a second resistance while the switch device is OFF according to a resistor controlling signal. The first resistance is higher than the second resistance, and the resistor controlling signal is changed corresponding to the switch controlling signal.

Preferably, a frequency of the high frequency signal regards a path passing through a parasitic capacitance between the input terminal and the control terminal as a conducting path while the switch device is ON, and regards a path passing through the parasitic capacitance between the input terminal and the output terminal as a conducting path while the switch device is OFF.

Preferably, the frequency of the high frequency signal is about 240 MHz.

Preferably, the first resistance of the variable resistor is higher than an impedance of the parasitic capacitance between the input terminal and the control terminal while the switch device is ON.

Preferably, the second resistance of the variable resistor is smaller than an impedance of the parasitic capacitance between the input terminal and the output terminal while the switch device is OFF.

Preferably, the switch device is a transmission gate consisted of an n-type metal-oxide-semiconductor field effect transistor and a p-type metal-oxide-semiconductor field effect transistor, and the control terminal includes a gate of the n-type metal-oxide-semiconductor field effect transistor and a gate of the p-type metal-oxide-semiconductor field effect transistor.

Preferably, the variable resistor includes a first variable resistor and a second variable resistor which are respectively connected to the gate of the n-type metal-oxide-semiconductor field effect transistor and the gate of the p-type metal-oxide-semiconductor field effect transistor.

Preferably, the resistor controlling signal is the switch controlling signal.

Preferably, the resistor controlling signal includes a first resistor controlling signal and a second resistor controlling signal which respectively control the first variable resistor and the second variable resistor.

According to another aspect of the present application, a multiplexer is provided, which is applicable to transmit a high frequency signal from one of a first input terminal and a second input terminal to an output terminal therethrough. The multiplexer includes a first switch device, a second switch device, a first variable resistor, and a second variable resistor. The first switch device is connected between the first input terminal and the output terminal and includes a first control terminal and configured to be switched between ON and OFF according to a first switch controlling signal provided to the first control terminal. The second switch device is connected between the second input terminal and the output terminal and includes a second control terminal which is configured to be switched between ON and OFF according to a second switch controlling signal provided to the second control terminal, wherein ON and OFF of the first switch device and ON and OFF of the second switch device are mutually exclusive; a first variable resistor connected to the first control terminal and configured to change to a first resistance while the first switch device is ON, and to change to a second resistance while the first switch device is OFF according to a first resistor controlling signal, and the first resistance is higher than the second resistance, and the first resistor controlling signal is changed corresponding to the first switch controlling signal. The second variable resistor is connected to the second control terminal and is configured to change to a third resistance while the second switch device is ON, and to change to a fourth resistance while the second switch device is OFF according to a second resistor controlling signal. The third resistance is higher than the fourth resistance, and the second resistor controlling signal is changed corresponding to the second switch controlling signal.

Preferably, a frequency of the high frequency signal regards a path passing through a first parasitic capacitance between the first input terminal and the first control terminal while the first switch device is ON, and regards a path passing through a third parasitic capacitance between the second input terminal and the second control terminal as a conducting path while the second switch device is ON, and regards a path passing through a second parasitic capacitance passing through the first input terminal and the output terminal while the first switch device is OFF, and regards a path passing through a fourth parasitic capacitance between the second input terminal and the output terminal as a conducting path while the second switch device are OFF.

Preferably, the frequency of the high frequency signal is about 240 MHz.

Preferably, the first resistance is higher than an impedance of the first parasitic capacitance, and the third resistance is higher than an impedance of the third parasitic capacitance.

Preferably, the second resistance is smaller than an impedance of the second parasitic capacitance, and the fourth resistance is smaller than an impedance of the fourth parasitic capacitance.

Preferably, the first switch device is a first transmission gate consisted of a first n-type metal-oxide-semiconductor field effect transistor and a first p-type metal-oxide-semiconductor field effect transistor, and the first control terminal includes a gate of the first n-type metal-oxide-semiconductor field effect transistor and a gate of the first p-type metal-oxide-semiconductor field effect transistor, and the second switch device is a second transmission gate consisted of a second n-type metal-oxide-semiconductor field effect transistor and a second p-type metal-oxide-semiconductor field effect transistor, and the second control terminal includes a gate of the second n-type metal-oxide-semiconductor field effect transistor and a gate of the second p-type metal-oxide-semiconductor field effect transistor.

Preferably, the first variable resistor includes a third variable resistor and a fourth variable resistor which are respectively connected to the gate of the first n-type metal-oxide-semiconductor field effect transistor and the gate of the first p-type metal-oxide-semiconductor field effect transistor, and the second variable resistor includes a fifth variable resistor and a sixth variable resistor which are respectively connected to the gate of the second n-type metal-oxide-semiconductor field effect transistor and the gate of the second p-type metal-oxide-semiconductor field effect transistor.

Preferably, the first resistor controlling signal is the first switch controlling signal, and the second resistor controlling signal is the second switch controlling signal.

Preferably, the first resistor controlling signal includes a third resistor controlling signal and a fourth resistor signal which respectively control the third variable resistor and the fourth variable resistor, and the second resistor controlling signal includes a fifth resistor controlling signal and a sixth resistor signal which respectively control the fifth variable resistor and the sixth variable resistor.

In conclusion, a switch and a multiplexer including the same disclosed in the present invention are configured to dispose the variable resistor in the circuit of the switch, and to adjust the variable resistor corresponding to the switch controlling signal through the resistor controlling signal, such that signal attenuation of the high frequency can be reduced while the switch device is ON and the unnecessary signal, which passes through the parasitic capacitance between the input terminal and the output terminal and then flows out of the output terminal, can be avoided while the switch device is OFF. The circuit framework including the switch and the multiplexer is also disposed with the variable capacitance to improve signal loss and crosstalk caused by the parasitic capacitance of the switch when the signal is transmitted through the switch. That is, signal attenuation and interference of the high frequency can be avoided synchronously.

BRIEF DESCRIPTION OF THE DRAWINGS

The above and other aspects of the invention will become better understood with regard to the following detailed description of the preferred but non-limiting embodiments. The following description is made with reference to the accompanying drawings.

DETAILED DESCRIPTION OF THE PREFERRED EMBODIMENTS

Figure 1A:
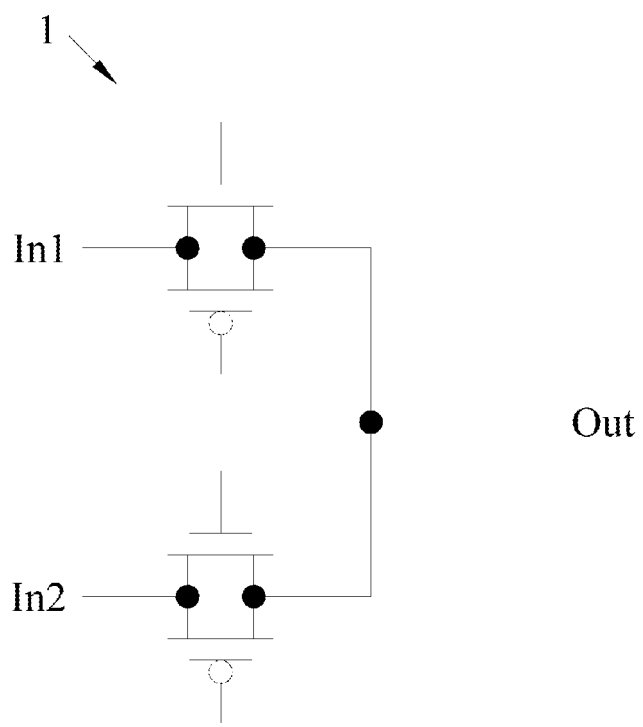
FIG. 1A is a circuit framework diagram of a conventional multiplexer.

Hereinafter, embodiments of the present invention will be described in detail with reference to the accompanying drawings so that those skilled in the art to which the present invention pertains can realize the present invention. As those skilled in the art would realize, the described embodiments may be modified in various different ways, all without departing from the spirit or scope of the present invention.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

The exemplary embodiments of the present invention will be understood more fully from the detailed description given below and from the accompanying drawings of various embodiments of the invention, which, however, should not be taken to limit the invention to the specific embodiments, but are for explanation and understanding only.

Figure 1B:
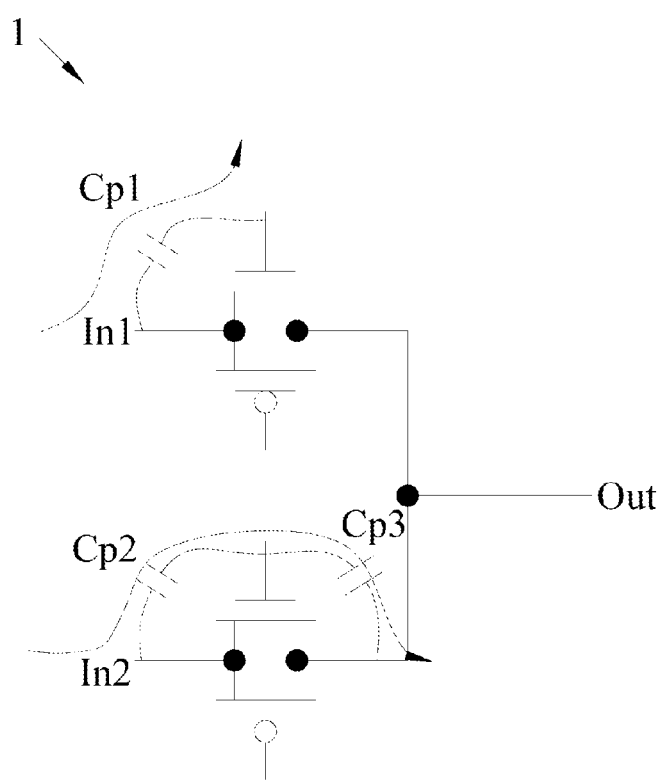
FIG. 1B is a schematic diagram showing the usage state of a conventional multiplexer.
Figure 2A:
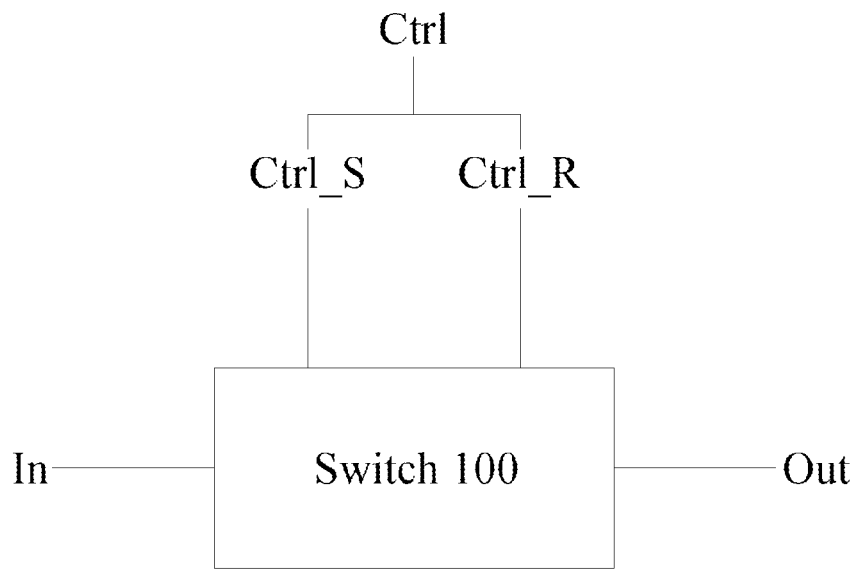
FIG. 2A is a block diagram illustrating the first embodiment of a switch in accordance with the present invention.
Figure 2B:
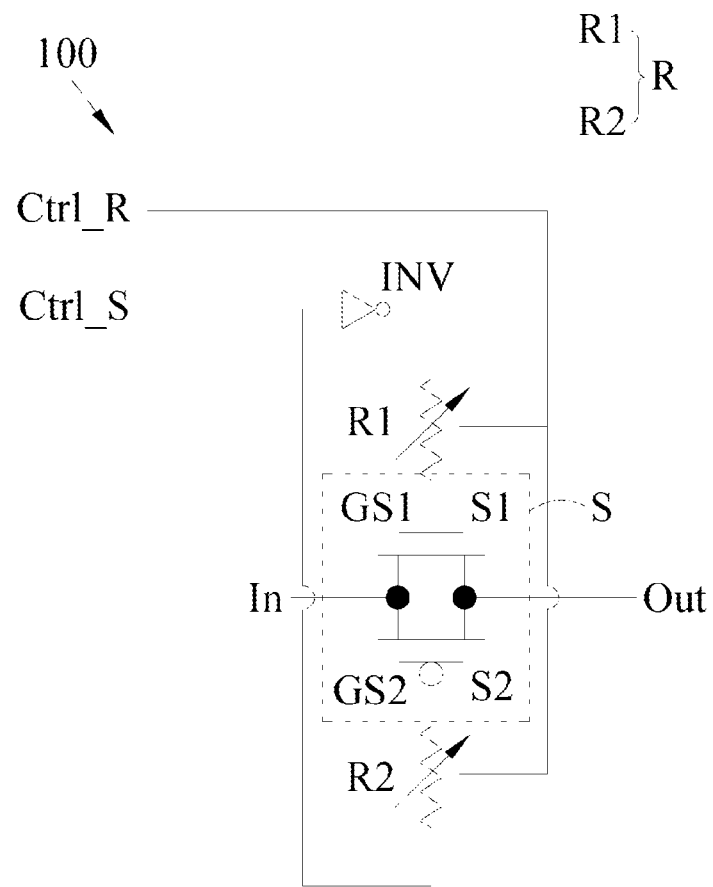
FIG. 2B is a circuit framework diagram illustrating the first embodiment of a switch in accordance with the present invention.

FIG. 2A is a block diagram illustrating the first embodiment of a switch in accordance with the present invention, and FIG. 2B is a circuit framework diagram illustrating the first embodiment of a switch in accordance with the present invention. As shown in FIG. 2A and FIG. 2B, a switch 100 is provided, which is applicable to transmit a high frequency signal from an input terminal In to an output terminal Out. A switch controlling signal Ctrl_S and a resistor controlling signal Ctrl_R are provided to the switch 100. The switch 100 includes a switch device S and a variable resistor R. The switch device S is connected between the input terminal In and the output terminal Out. Here, intrinsically (i.e. without the variable resistor R and the control of the resistor controlling signal Ctrl_R), a frequency of the high frequency signal regards a path passing through a parasitic capacitance between the input terminal In and a control terminal as a conducting path while the switch device S is ON, and regards a path passing through a parasitic capacitance between the input terminal In and the output terminal Out as a conducting path while the switch device S is OFF. As shown in FIG. 1B, the arrows, which pass through the parasitic capacitances Cp1, Cp2 and Cp3, are denoted as the conducting paths.

As shown in FIG. 2B, the switch device S is a transmission gate consisted of an n-type metal-oxide-semiconductor field effect transistor (NMOS) and a p-type metal-oxide-semiconductor field effect transistor (PMOS). Here, the switch device S is indicated as a first switch S1 and a second switch S2. A control terminal of the switch device S includes a gate GS1 of the first switch S1 and a gate GS2 of the second switch S2. The first switch S1 and the second switch S2 are configured to enable the switch device S to be switched between ON and OFF according to the switch controlling signal Ctrl_S provided to the control terminal. Preferably, in the specific embodiment of the present invention, as the polarities of the first switch S1 and the second switch S2 are opposite, the gate GS1 of the first switch needs to be connected to an inverter INV as shown in FIG. 2B for inverting the logical potential provided to the switch controlling signal Ctrl_S of the control terminal and transmitted to the gate GS1 and the gate GS2, such that the first switch S1 and the second switch S2 can be ON and OFF simultaneously, so as to further control the switch device S to be switched between ON and OFF. Here, the inverter INV may be a NMOS inverter, a PMOS inverter, a transistor-transistor logic (TTL) inverter, a static complementary metal oxide semiconductor (CMOS) inverter, a saturated-load NMOS inverter, a resistor-transistor logic inverter, and so on.

As shown in the FIGS., a variable resistor R is connected to the control terminals and includes a first variable resistor R1 and a second variable resistor R2 which are respectively connected to the gate GS1 of the first switch S1 and the gate GS2 of the second switch S2. The resistances of the first variable resistor R1 and the second variable resistor R2 are controlled by the resistor controlling signal Ctrl_R. In more detail, the first variable resistor R1 and the second variable resistor R2 are configured to be change to a first resistance while the switch device S is ON, and to be change to a second resistance while the switch device S is OFF according to the resistor controlling signal Ctrl_R. The first resistance is higher than the second resistance, and the resistor controlling signal Ctrl_R is changed corresponding to the switch controlling signal Ctrl_S.

In order to enable the high frequency signal, which passes through the switch 100, to disregard the path passing through the parasitic capacitance between the input terminal In and the control terminals as the conducting path while the switch device S is ON, the resistor controlling signal Ctrl_R is controlled to enable that the first resistance of the first variable resistor R1 and the second resistor R2 has to be larger than an impedance of the parasitic capacitance between the input terminal and the control terminal while the switch device S is ON. By controlling the first resistance, the high frequency signal selects a conducting path which has lower impedance while the switch device S is ON. That is, the parasitic capacitance produced between the input terminal In and the output terminal Out is served as the conducting path, such as the parasitic capacitances Cp2 and Cp3 as shown in FIG. 1B, such that the high frequency signal may be prevented from flowing out of the control terminal to cause the signal loss.

Besides, in order to enable the high frequency signal, which passes through the switch 100, to disregard the path passing through the parasitic capacitance between the input terminal In and the output terminal as the conducting path while the switch device S is OFF, the resistor controlling signal Ctrl_R is controlled to enable that the second resistance of the first variable resistor R1 and the second resistor R2 has to be smaller than an impedance of the parasitic capacitance between the input terminal and the output terminal while the switch device S is OFF. By controlling the first variable resistor R1 and changing the second variable resistor R2 into the second resistance, the high frequency signal selects the conducting path which has lower impedance while the switch device S is OFF. That is, the parasitic capacitance produced between the input terminal In and the control terminal is served as the conducting path, such as the parasitic capacitance Cp1 as shown in FIG. 1B, and the high frequency signal may be prevented from interfering the output terminal while the switch device S is OFF.

Moreover, in the present embodiment, the switch controlling signal Ctrl_S and the resistor controlling signal Ctrl_R may be coupled as a control signal Ctrl to control the variable resistor and the ON and OFF states of the switch synchronously. Hence, by respectively controlling the variable resistors while the switch device S is ON and OFF, the attenuations and interferences from the high frequency signal can be respectively reduced while the switch device S is ON and OFF.

Figure 3A:
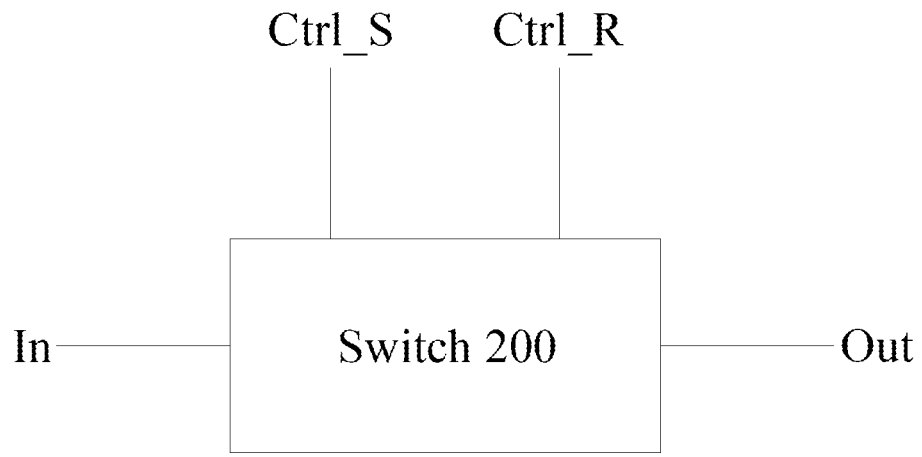
FIG. 3A is a block diagram illustrating the second embodiment of a switch in accordance with the present invention.
Figure 3B:
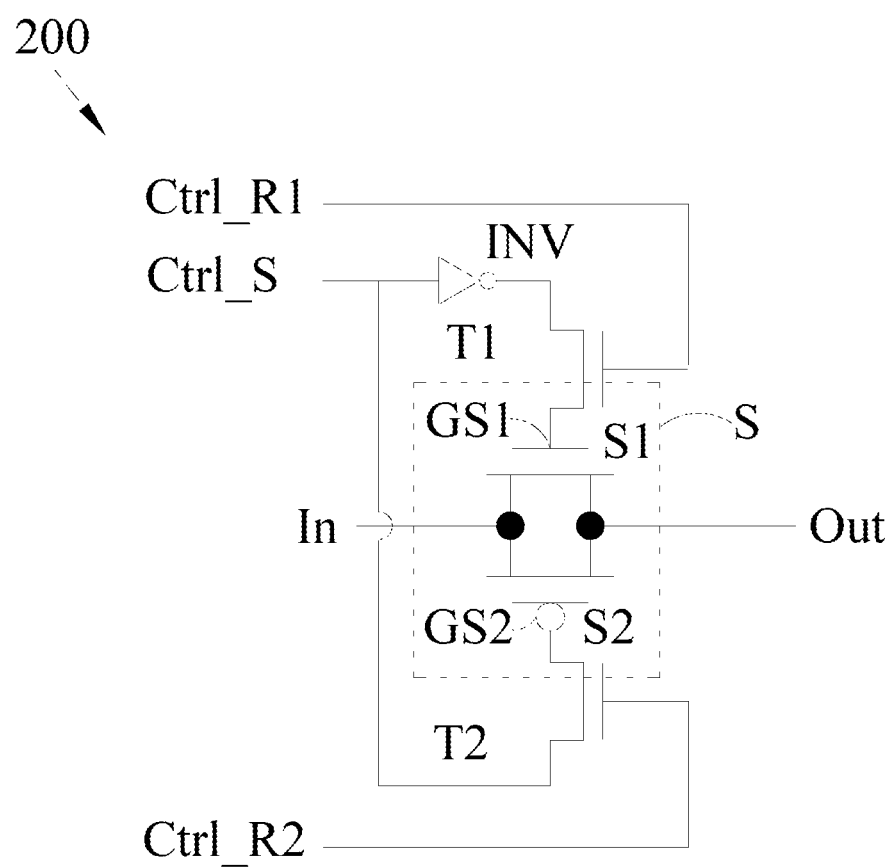
FIG. 3B is a circuit framework diagram illustrating the second embodiment of a switch in accordance with the present invention.

FIG. 3A is a block diagram illustrating the second embodiment of a switch in accordance with the present invention, and FIG. 3B is a circuit framework diagram illustrating the second embodiment of a switch in accordance with the present invention. As shown in FIG. 3A and FIG. 3B, another aspect of the switch 200 is provided, and the switch controlling signal Ctrl_S and the resistor controlling signal Ctrl_R are provided to the switch 200. The difference between the present embodiment and the former one lies in that the switch 100 includes the switch device S, a first transistor T1 and a second transistor T2. The switch device S is connected between the input terminal In and the output terminal Out. Here, intrinsically (i.e. without the first and second transistors T1, T2, and the control of the resistor controlling signal Ctrl_R), the frequency of the high frequency signal regards the path passing through the parasitic capacitance between the input terminal In and the control terminal as a conducting path while the switch device S is ON, and regards the path passing through the parasitic capacitance between the input terminal In and the output terminal Out as a conducting path while the switch device S is OFF. As shown in FIG. 1B, the arrows, which pass through the parasitic capacitances Cp1, Cp2 and Cp3, are denoted the conducting paths.

As shown in FIG. 3B, the switch device S is a transmission gate consisted of an n-type metal-oxide-semiconductor field effect transistor (NMOS) and a p-type metal-oxide-semiconductor field effect transistor (PMOS) and are indicated as a first switch S1 and a second switch S2. Control terminals of the switch device S include a gate GS1 of the first switch S1 and a gate GS2 of the second switch S2. The first switch S1 and the second switch S2 are configured to enable the switch device S to be switched between ON and OFF according to the switch controlling signal Ctrl_S provided to the control terminal. Preferably, in the specific embodiment of the present invention, as the polarities of the first switch S1 and the second switch S2 are opposite, the gate GS1 of the first switch S1 needs to be connected to an inverter INV for inverting the logical potential provided to the switch controlling signal Ctrl_S of the control terminal and transmitted to the gate GS1 and the gate GS2, such that the first switch S1 and the second switch S2 can be ON and OFF simultaneously, so as to further control the switch device S to be switched between ON and OFF.

As shown in the FIGS., what has to be detailed is that the first transistor T1 and the second transistor T2 are connected to the gate GS1 of the first switch S1 and the gate GS2 of the second switch S2, respectively. The resistor controlling signal Ctrl_R includes a first resistor controlling signal Ctrl_R1 and a second resistor controlling signal Ctrl_R2. An operation of the first transistor T1 is controlled by the first resistor controlling signal Ctrl_R1, and an operation of the second transistor T2 is controlled by the second resistor controlling signal Ctrl_R2. Here, the first transistor T1 and the second transistor T2 may be the known metal-oxide-semiconductor field effect transistor. In more detail, the first resistor controlling signal Ctrl_R1 is provided to a gate of the first transistor T1 to change the impedance between the drain and source of the first transistor T1 by controlling the voltage of the gate terminal, such that the function of the first variable resistor, which is similar to the first variable resistor R1 in the former embodiment, can be achieved. The second resistor controlling signal Ctrl_R2 is provided to the gate of the second transistor T2 to change the impedance between the drain and source of the second transistor T2 by controlling the voltage of the gate terminal, such that the function, which is similar to the second variable resistor R2, can be achieved.

For example, the first transistor T1 and the second transistor T2 are respectively changed into the first resistance while the switch device S is ON and into the second resistance while the switch device S is OFF according to the first resistor controlling Ctrl_R1 and the second resistor controlling signal Ctrl_R2. The first resistance is higher than the second resistance, and the resistor controlling signal Ctrl_R including the first resistor controlling signal Ctrl_R1 and the second resistor controlling signal Ctrl_R2 is changed corresponding to the switch controlling signal Ctrl_S.

In order to enable the high frequency signal, which passes through the switch 200, to disregard the path passing through the parasitic capacitance between the input terminal In and the control terminal as the conducting path while the switch device S is ON, the resistor controlling signal Ctrl_R is controlled to enable that the first resistance between the source and drain of the first transistor T1 and those of the second transistor T2 has to be larger than an impedance of the parasitic capacitance between the input terminal and the control terminal while the switch device S is ON. By controlling the first resistance of the first transistor T1 and the second transistor T2, the high frequency signal selects a conducting path which has lower impedance while the switch device S is ON. That is, the parasitic capacitances produced between the input terminal In and the output terminal Out are served as the conducting paths, such as the parasitic capacitances Cp2 and Cp3 as shown in FIG. 1B, and the high frequency signal is prevented from flowing out from the control terminal to cause the signal loss.

Besides, in order to enable the high frequency signal, which passes through the switch 200, to disregard the path passing through parasitic capacitance between the input terminal In and the output terminal as the conducting path while the switch device S is OFF, the resistor controlling signal Ctrl_R, which is coupled by the first resistor controlling signal Ctrl_R1 and the second resistor controlling signal Ctrl_R2, is controlled to enable that the second resistance between the source and drain of the first transistor T1 and the second transistor T2 has to be smaller than an impedance of the parasitic capacitance between the input terminal and the output terminal while the switch device S is OFF. By controlling the first variable resistor R1 and changing the second variable resistor R2 into the second resistance, the high frequency signal selects the conducting path which has lower impedance while the switch device S is OFF. That is, the paths passing through the parasitic capacitances produced between the input terminal In and the control terminal are served as the conducting paths, such as the parasitic capacitances Cp2 and Cp3 as shown in FIG. 1B, and the high frequency signal is prevented from interfering the output terminal while the switch device S is OFF.

Figure 4A:
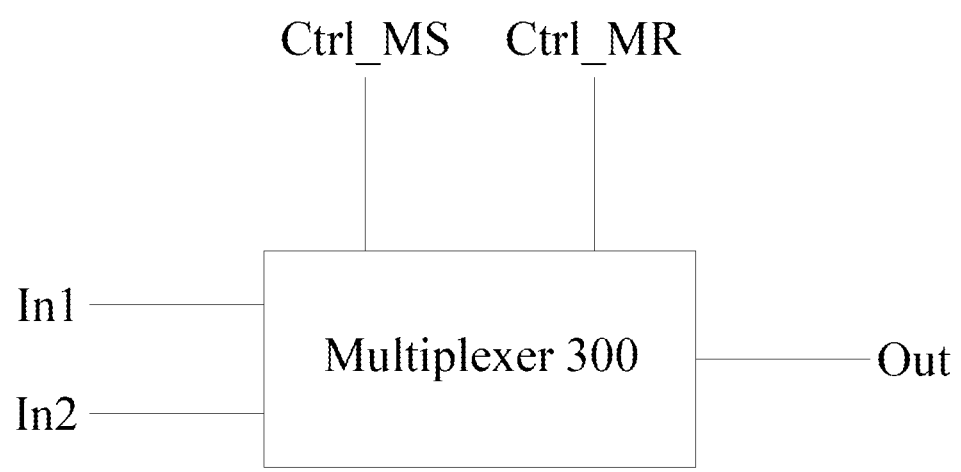
FIG. 4A is a block diagram illustrating the first embodiment of a multiplexer in accordance with the present invention.
Figure 4B:
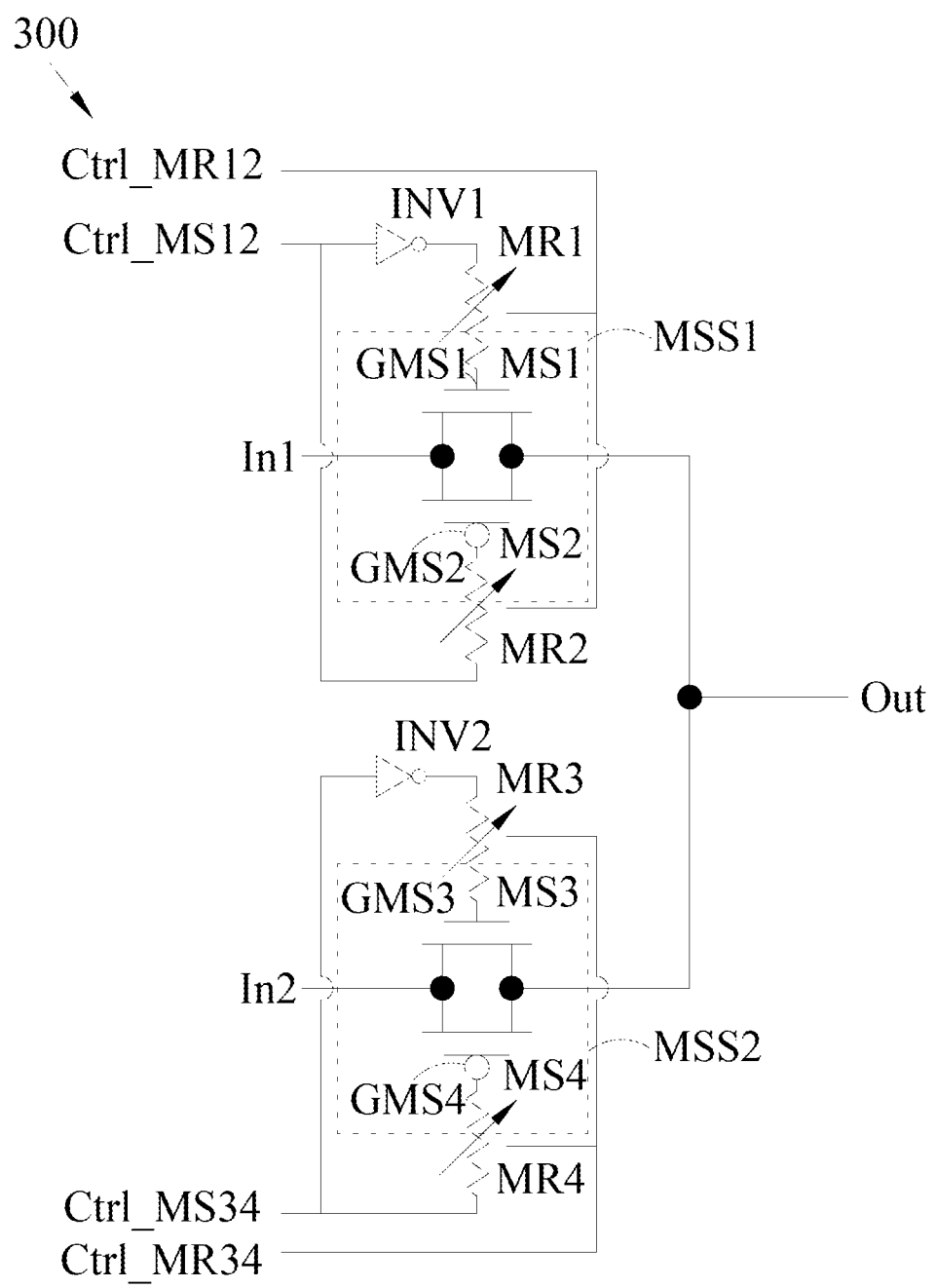
FIG. 4B is a circuit framework diagram illustrating the first embodiment of a multiplexer in accordance with the present invention.

FIG. 4A is a block diagram illustrating the first embodiment of a multiplexer in accordance with the present invention, and FIG. 4B is a circuit framework diagram illustrating the first embodiment of a multiplexer in accordance with the present invention. According to another aspect of the present invention, a multiplexer 300 is provided, which is applicable to transmit a high frequency signal from one of a first input terminal In1 and a second input terminal In 2 to an output terminal Out therethrough. A switch controlling signal Ctrl_MS and a resistor controlling signal Ctrl_MR are provided to the multiplexer 300. The multiplexer 300 includes a first switch device MSS1, a second switch device MSS2, a first variable resistor MR1, a second variable resistor MR2, a third variable resistor MR3, and a fourth variable resistor MR4. The first switch device MSS1 is connected between the first input terminal In 1 and the output terminal out, and the second switch device MSS2 is connected between the second input terminal In 2 and the output terminal Out.

Here, a frequency of the high frequency signal regards a path passing through a parasitic capacitance (hereinafter referred to as the first parasitic capacitance) between the first input terminal In1 and the control terminal while the first switch device MSS1 is ON, and regards a path passing through a parasitic capacitance (hereinafter referred to as the third parasitic capacitance) between the second input terminal In2 and the control terminal as a conducting path while the second switch device MSS2 is ON, and regards a path passing through a parasitic capacitance (hereinafter referred to as the second parasitic capacitance) between the first input terminal In1 and the output terminal Out while the first switch device MSS1 is OFF, and regards a path passing through a parasitic capacitance (hereinafter referred to as the fourth parasitic capacitance) the first input terminal In1 and the output terminal Out as a conducting path while the second switch device MSS2 is OFF. As shown in FIG. 1B, the arrows, which pass through the parasitic capacitances Cp1, Cp2 and Cp3, are denoted as the conducting paths.

As shown in FIG. 4B, the first switch device MSS1 is connected between the first input terminal In1 and the output terminal Out, and the first switch device MSS1 may be a transmission gate consisted of a n-type metal-oxide-semiconductor field effect transistor and a p-type metal-oxide-semiconductor field effect transistor and are indicated as a first switch MS1 and a second switch MS2. A first control terminal of the first switch device MSS1 includes a gate GS2 of the first switch MS1 and a gate GS2 of the second switch MS2. The first switch MS1 and the second switch MS2 are configured to enable the first switch device MSS1 to be switched between ON and OFF according to the first switch controlling signal Ctrl_MS12. Preferably, in the specific embodiment of the present invention, as the polarities of the first switch MS1 and the second switch MS2 are opposite, the gate GMS1 of the first switch needs to be connected to a first inverter INV1 as shown in FIG. 4B for inverting the logical potential provided to the first switch controlling signal Ctrl_MS12 of the control terminal and transmitted to the gate GMS1 and the gate GMS2, enabling that the first switch MS1 and the second switch MS2 can be ON and OFF simultaneously, so as to further control the first switch device MSS1 to be switched between ON and OFF. Here, the first inverter INV1 may be a NMOS inverter, a PMOS inverter, a transistor-transistor logic (TTL) inverter, a static complementary metal oxide semiconductor (CMOS) inverter, a saturated-load NMOS inverter, a resistor-transistor logic inverter, and so on.

As the mentioned above, a first variable resistor MR1 is connected to the gate GMS1 and a second variable resistor MR2 is connected to the gate GMS2. The first resistor controlling signal Ctrl_MR12 is configured to control the resistances of the first variable resistor MR1 and the second variable resistor MR2 according to the first switch controlling signal Ctrl_MS12. For example, the first resistor controlling signal Ctrl_MR12 controls the resistances of the first variable resistor MR1 and the second variable resistor MR2 as the first resistance while the first switch device MSS1 is ON, and controls the resistances of the first variable resistor MR1 and the second variable resistor MR2 as the second resistance while the first switch device MSS1 is OFF. Preferably, the first resistance is higher than the second resistance.

Moreover, the second switch device MSS2 is connected between the second input terminal In2 and the output terminal Out, and the second switch device MSS2 may be a transmission gate consisted of a n-type metal-oxide-semiconductor field effect transistor and a p-type metal-oxide-semiconductor field effect transistor, and are indicated as a third switch MS3 and a fourth switch MS4. A second control terminal of the second switch device MSS2 includes a gate GMS3 of the third switch MS3 and a gate GMS2 of the fourth switch MS4. The third switch MS3 and the fourth switch MS4 are configured to enable the second switch device MSS2 to be switched between ON and OFF according to the second switch controlling signal Ctrl_MS34. Preferably, in the specific embodiment of the present invention, as the polarities of the third switch MS3 and the fourth switch MS4 are opposite, the gate GMS3 of the third switch needs to be connected to a second inverter INV2 as shown in FIG. 4B for inverting the logical potential provided to the second switch controlling signal Ctrl_MS34 of the control terminal and transmitted to the gate GMS3 and the gate GMS4, such that the third switch MS3 and the fourth switch MS4 can be ON and OFF simultaneously, so as to further control the second switch device MSS2 to be switched between ON and OFF. Here, the second inverter INV2 may be a NMOS inverter, a PMOS inverter, a transistor-transistor logic (TTL) inverter, a static complementary metal oxide semiconductor (CMOS) inverter, a saturated-load NMOS inverter, a resistor-transistor logic inverter, and so on.

Similarly, a third variable resistor MR3 is connected to the gate GMS3 and a fourth variable resistor MR4 is connected to the gate GMS3. The second resistor controlling signal Ctrl_MR34 is configured to control the resistances of the third variable resistor MR3 and the fourth variable resistor MR4 according to the second switch controlling signal Ctrl_MS34. For example, the second resistor controlling signal Ctrl_MR34 controls the resistances of the third variable resistor MR3 and the fourth variable resistor MR4 as the third resistance while the second switch device MSS2 is ON, and controls the resistances of the third variable resistor MR3 and the fourth variable resistor MR4 as the fourth resistance while the second switch device MSS2 is OFF. Preferably, the third resistance is higher than the fourth resistance.

Here, according to the operations of the multiplexer 300, states of ON and OFF of the first switch device MSS1 and that of the second switch device MSS2 are mutually exclusive. That is, the multiplexer 300 enables one of the first switch device MSS1 and the second switch device MSS2 to be ON, and the other to be OFF according to the switch controlling signal Ctrl_MS provided to the multiplexer 300. Hence, only one of the high frequency signals inputed to the first input terminal In1 and the second input terminal In2, can pass through the output terminal. However, such mode of the conduction therebetween shown in FIG. 1B may cause the attenuations and interferences of the high frequency signal simultaneously. The related details for improving the conductions therebetween will be described as follows.

Please backward to FIG. 4B. In the embodiment, when the multiplexer 300 is configured to enable the high frequency signal passing through the first switch device MSS1, the first switch device MSS1 and the second switch device MSS2 are controlled by the control signal Ctrl_MS. That is, the first switch controlling signal Ctrl_MS12 is configured to enable the first switch device MSS1 to be ON, and the second switch controlling signal Ctrl_MS34 is configured to enable the second switch device MSS2 to be OFF. The high frequency signal, which passes through the first switch device MSS1, is tend to regard the path passing through the parasitic capacitance between the first input terminal In 1 and the control terminal (i.e. the gate GMS1 and the gate GMS2) as the conducting path while the first switch device MSS1 is ON. So, the first resistor controlling signal Ctrl_MR12 is configured to enable the first variable resistor MR1 and the second variable resistor MR2 to become the resistor which is higher than the impedance of the first parasitic capacitance, so as to be served as the first resistance. When the first resistance exists, the high frequency signal, which passes through the first switch device MSS1, is hardly to pass through the first parasitic capacitance between the first input terminal In 1 and the control terminal (i.e. the gate GMS1 and the gate GMS2) to cause the signal loss.

In addition, the high frequency signal, which comes from the second input terminal In2, is tend to regard the path passing through the parasitic capacitance between the second input terminal In2 and the output terminal Out as the conducting path while the second switch device MSS2 is OFF, that indirectly resulting that the high frequency signal, which is preset to be output from the output terminal Out, is interfered by the high frequency signal from the second input terminal In2. Hence, the third variable resistor MR3 and the fourth variable resistor MR4 are changed as the resistances which are lower than the impedance of the fourth parasitic capacitance, namely, the fourth resistance. When the fourth resistance exists, the high frequency signal, which is input form the second input output terminal In2, is hardly to pass through the fourth parasitic capacitance between the second input terminal In2 and the output terminal Out, resulting that the high frequency signal, which is preset to be output from the output terminal Out, is interfered by the high frequency signal that comes from the second input terminal In2.

On the contrary, when the multiplexer 300 is configured to enable the high frequency signal to pass through the second switch device MSS2, the first resistor controlling signal Ctrl_MR12 is configured to enable the resistances of the variable resistor MR1 and the second variable resistor MR2 to be lower than the impedance of the second parasitic capacitance, namely, the second resistance. Besides, the second resistor controlling signal Ctrl_MR34 is configured to enable the resistances of the third variable resistor MR3 and the fourth variable resistor MR4 to be higher than the impedance of the third parasitic capacitance, namely, the third resistance. As mentioned above, the high frequency signal, which is input to the first output terminal In1, is hardly to pass through the second parasitic capacitance between the first input terminal In1 and the output terminal Out, resulting that the high frequency, which is preseted to be output from the output terminal Out, is interfered by the high frequency signal from the first input terminal In1. The high frequency signal, which passes through the second switch device MSS2, is hardly to pass through the third parasitic capacitance between the second input terminal In2 and the control terminal (i.e. the gate GMS3 and the gate GMS4) to cause the signal loss. In the specific embodiment, the first resistance is the same as the third resistance, and the second resistance is the same as the fourth resistance.

Figure 5A:
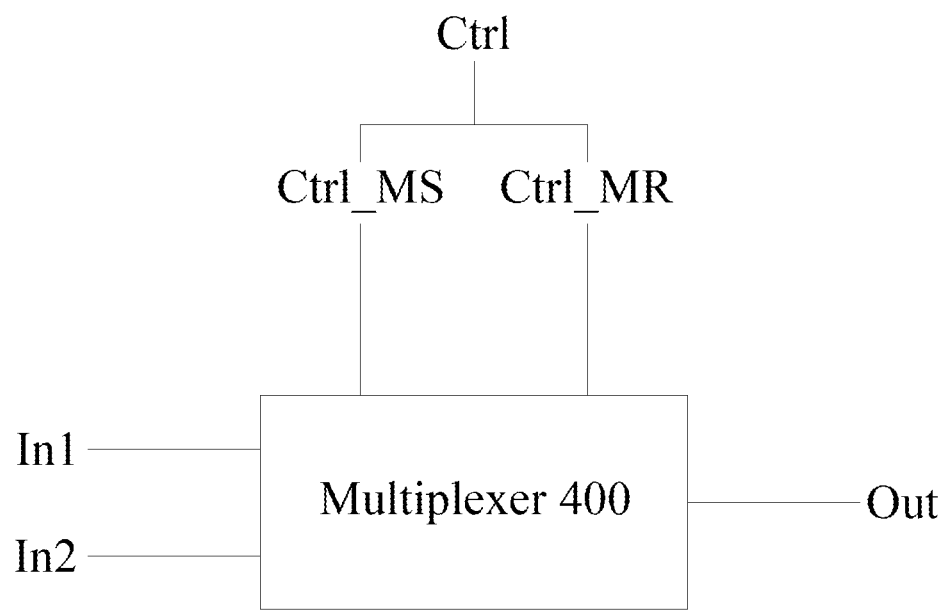
FIG. 5A is a block diagram illustrating the second embodiment of a multiplexer in accordance with the present invention.
Figure 5B:
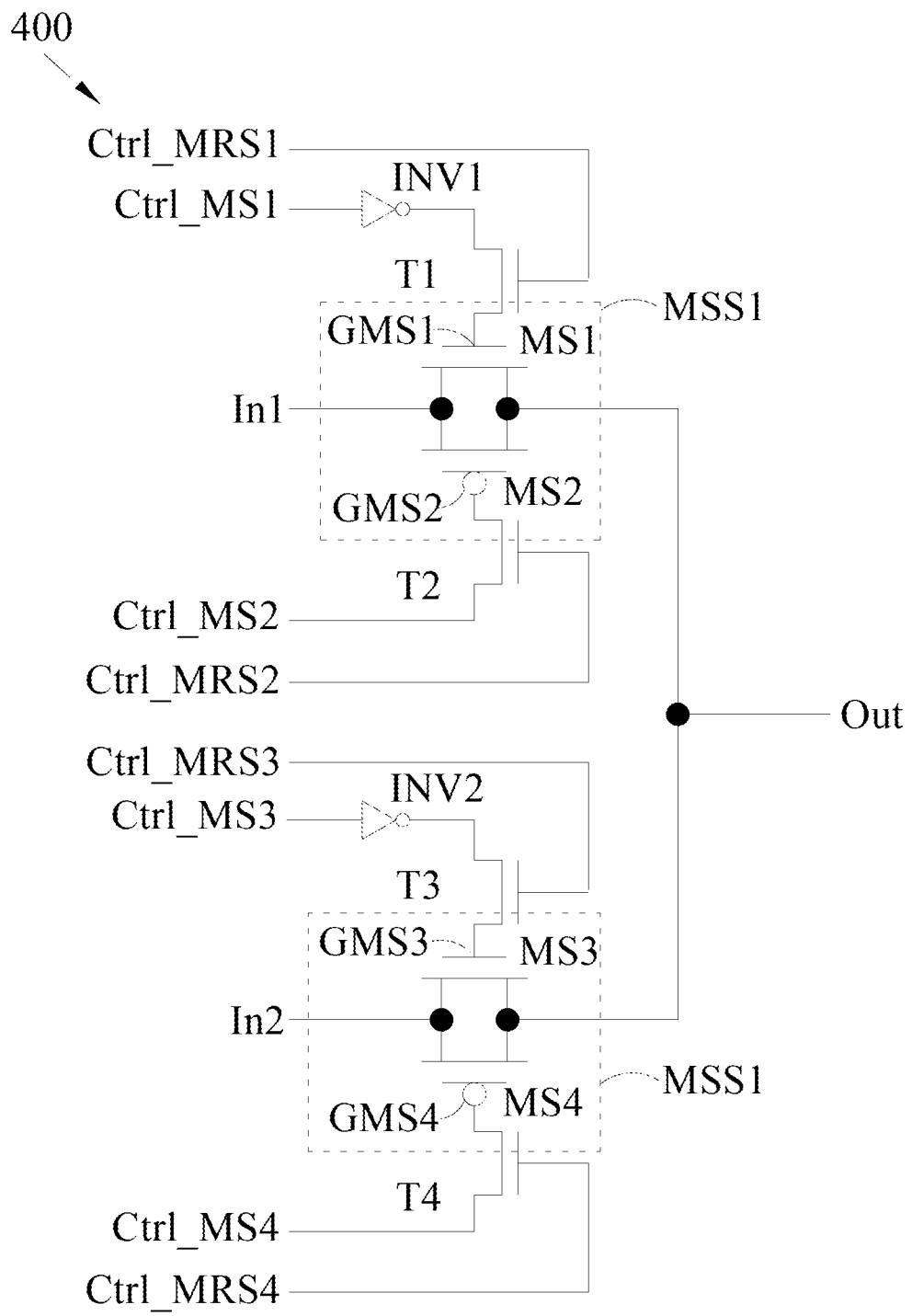
FIG. 5B is a circuit framework diagram illustrating the second embodiment of a multiplexer in accordance with the present invention.

FIG. 5A is a block diagram illustrating the second embodiment of a multiplexer in accordance with the present invention, and FIG. 5B is a circuit framework diagram illustrating the second embodiment of a multiplexer in accordance with the present invention. According to another aspect of the present invention, the multiplexer 400 is provided, which is applicable to transmit a high frequency signal from one of the first input terminal In1 and the second input terminal In2 to the output terminal Out therethrough. The switch controlling signal Ctrl_MS and the resistor controlling signal Ctrl_MR are provided to the multiplexer 400. The multiplexer 400 includes the first switch device MSS1, the second switch device MSS2, the first transistor T1, the second transistor T2, the third transistor T3 and the fourth transistor T4. The first switch device MSS1 is connected between the first input terminal In1 and the output terminal Out, and the second switch device MSS2 is connected between the second input terminal In2 and the output terminal Out, and the operations of the first switch device MSS1 and the second switch device MSS2 are identical to that of the former embodiment. Hence, the unnecessary details are omitted herein.

The difference between the present embodiment and the former one lies in that the first variable resistor MR1, the second variable resistor MR2, the third variable resistor MR3 and the fourth resistor MR4 are replaced by the first transistor T, the second transistor T2, the third transistor T3 and the fourth transistor T4, respectively. The first resistor controlling signal Ctrl_MRS1, the second resistor controlling signal Ctrl_MRS2, the third resistor controlling signal Ctrl_MRS4 are respectively provided to the gates of first transistor T, the second transistor T2, the third transistor T3 and the fourth transistor T4 to respectively control the first transistor T, the second transistor T2, the third transistor T3 and the fourth transistor T4 to be ON, and to control the impedance between the drain and source, so as to achieve the functions which are similar to the first variable resistor MR1, the second variable resistor MR2, the third variable resistor MR3 and the fourth resistor MR4.

Preferably, in the specific embodiment, configurations of the first inverter INV1 and the second inverter INV2 are similar to that of the former embodiment, and the difference lies in that the first inverter INV1 is applied to invert the logical potentials of the first switch controlling signal Ctrl_MS1 transmitted to the gate GMS1 and the second switch controlling signal Ctrl_MS2 transmitted to the gate GMS2, and the second inverter INV2 is applied to invert the logical potentials of the third switch controlling signal Ctrl_MS3 transmitted to the gate GMS3 and the fourth switch controlling signal Ctrl_MS4 transmitted to the gate GMS4, such that the first switch MS1 and the second switch MS2 can be respectively switched between ON and OFF simultaneously, and the third switch MS3 and the fourth switch MS4 can be respectively switched between ON and OFF simultaneously, so as to further control the first switch device MSS1 and the second switch device MSS2 to be switched between ON and OFF. Here, the first inverter INV1 and the second inverter INV2 may be a NMOS inverter, a PMOS inverter, a transistor-transistor logic (TTL) inverter, a static complementary metal oxide semiconductor (CMOS) inverter, a saturated-load NMOS inverter, a resistor-transistor logic inverter, and so on.

Here, as mentioned above, according to the operations of the multiplexer 400, states of ON and OFF of the first switch device MSS1 and that of the second switch device MSS2 are mutually exclusive. That is, the multiplexer 400 enables one of the first switch device MSS1 and the second switch device MSS2 to be ON and the other to be OFF according to the first switch controlling signal Ctrl_MRS1 and the second switch controlling signal Ctrl_MRS2 provided to the first switch device MSS1, and the third switch controlling signal Ctrl_MRS3 and the fourth switch controlling signal Ctrl_MRS4 provided to the second switch device MSS2. Hence, only one of the high frequency signals, which are inputted to the first input terminal In1 and the second input terminal In2, can pass through the output terminal. However, such mode of conduction may be affected by the first to the fourth parasitic capacitances mentioned in the former embodiment and cause the attenuations and interferences of the high frequency signal simultaneously.

Please backward to FIG. 5B. In the embodiment, when the multiplexer 400 is configured to enable the high frequency signal passing through the first switch device MSS1, the first switch device MSS1 and the second switch device MSS2 are controlled by the control signal Ctrl_MS. That is, the first switch controlling signal Ctrl_MS1 and the second switch controlling signal Ctrl_MS2 are configured to enable the first switch device MSS1 to be ON, and the third switch controlling signal Ctrl_MS3 and the fourth switch controlling signal Ctrl_MS4 are configured to enable the second switch device MSS2 to be OFF. Here, the first switch controlling signal Ctrl_MS1 and the second switch controlling signal Ctrl_MS2 may be the same source of signal. The high frequency signal, which passes through the first switch device MSS1, is tend to regard the path passing through the parasitic capacitance between the first input terminal In1 and the control terminal (i.e. the gate GMS1 and the gate GMS2) as the conducting path while the first switch device MSS1 is ON. So, the first switch controlling signal Ctrl_MS1 and the second switch controlling signal Ctrl_MS2 are configured to enable the resistance between the drain and source of the first transistor T1 and the second transistor T2 to be higher than the impedance of the first parasitic capacitance, for being served as the first resistance. When the first resistance exists, the high frequency signal, which passes through the first switch device MSS1, is hardly to pass through the first parasitic capacitance between the first input terminal In1 and the control terminal (i.e. the gate GMS1 and the gate GMS2) to cause the signal loss.

The high frequency signal, which passes through the first switch device MSS2, is tend to regard the path passing through the fourth parasitic capacitance between the second input terminal In2 and the output terminal Out as the conducting path while the second switch device MSS2 is OFF. Hence, the third resistor controlling signal Ctrl_MRS3 and the fourth resistor controlling signal Ctrl_MRS4 are configured to enable the resistance between the drain and source of the third transistor T3 and the transistor T4 to be higher than the impedance of the fourth parasitic capacitance, namely, the fourth resistance. When the fourth resistance exists, the high frequency signal, which passes through the second switch device MSS2, is hardly to pass through the fourth parasitic capacitance between the second input terminal In2 and the output terminal to cause the distortion of the high frequency signal. In other words, when the impedance between the drain and source of the third transistor T3 and the fourth transistor T4 is higher than the impedance of the fourth parasitic capacitance, the high frequency signal of the second input terminal In2 selects the path which has lower impedance, such that the interferences of the high frequency signal at the output terminal Out is reduced.

On the contrary, when the multiplexer 400 is configured to enable the high frequency signal passing through the second switch device MSS2, the third resistor controlling signal Ctrl_MRS3 and the fourth resistor controlling signal Ctrl_MRS4 are configured to enable the resistance between the drain and source of the transistor T3 and the fourth transistor T4 to be higher than the impedance of the third parasitic capacitance, namely, as the third resistance. Simultaneously, the first resistor controlling signal Ctrl_MRS1 and the second resistor controlling signal Ctrl_MRS2 are configured to enable the resistance between the drain and source of the first transistor T1 and the second transistor T2 to be changed to be higher than the impedance of the second parasitic capacitance, for being served as the second resistance. As mentioned above, the high frequency signal, which is input to the first output terminal In1, is hardly to pass through the second parasitic capacitance between the first input terminal In1 and the output terminal Out, resulting that the high frequency, which is preset to be output from the output terminal Out, is interfered by the high frequency signal from the first input terminal In1. The high frequency signal, which passes through the second switch device MSS2, is hardly to pass through the third parasitic capacitance between the second input terminal In2 and the control terminal (i.e. the gate GMS3 and the gate GMS4) to cause the signal loss. In the specific embodiment, the first resistance is the same as the third resistance, and the second resistance is the same as the fourth resistance.

In the present embodiment, it is noteworthy that the first transistor T1, the second transistor T2, the third transistor T3, and the fourth transistor T4 may be an n-type metal-oxide-semiconductor field effect transistor or a p-type metal-oxide-semiconductor field effect transistor, and are mainly utilized to implement the variable resistors. When the polarities of the first transistor T1 and the second transistor T2 match that of the first switch MS1 and the second switch MS2 of the first switch device MSS1, the first switch controlling signal Ctrl_MS1, the second switch controlling signal Ctrl_MRS2, the first resistor controlling signal Ctrl_MRS1 and the second resistor controlling single Ctrl_MRS2 may be the same signal sources. When the polarities of the third transistor T3 and the fourth transistor T4 match that of the third switch MS3 and the fourth switch MS4 of the second switch device MSS2, the third switch controlling signal Ctrl_MS3, the fourth switch controlling signal Ctrl_MS4, the third resistor controlling signal Ctrl_MRS3 and the fourth resistor controlling signal Ctrl_MRS4 may be the same signal sources. That is, a single signal is applied to simultaneously control the first switch device MSS1 to be switched between ON and OFF and the impedance between the drain and source of the first transistor T1 and the second transistor T2. Besides, the single signal is also applied to simultaneously control the second switch device MSS2 to be switched between ON and OFF and the impedance between the drain and source of the third transistor T3 and the fourth transistor T4, and these signals are all included in the control signal Ctrl as shown in FIG. 5.

Table 1 shows the simulation result (indicated as S21 and S23, respectively) of the attenuations of the high frequency signal between the first input terminal In1 and the output terminal Out and the second input terminal In2 and the output terminal Out, when the first resistance and the fourth resistance are changed according to the configurations of the multiplexer 400 while the first switch device MSS1 is ON and the second switch device MSS2 is OFF. The high frequency signal with a frequency of 240 MHz are provided to both of the first input terminal In1 and the second input terminal In2.

TABLE 1

| First resistance (ohm) | 10K | 5K | 1K | 10K |
|---|---|---|---|---|
| Fourth resistance (ohm) | 10K | 5K | 1K | 0.1K |
| S21 (dB) | −0.47 | −0.51 | −0.67 | −0.48 |
| S23 (dB) | −45.8 | −46.1 | −49.5 | −63.2 |

As shown in the Table 1, the simulation is performed by respectively controlling the impedance of the first resistance and the fourth resistance between 0.1 KΩ and 10 KΩ. When the first switch device MSS1 is ON, the second switch device MSS2 is OFF and the first resistance and the fourth resistance are both 5 KΩ, the signal between the first input terminal In1 and the output terminal Out has less signal attenuation by −0.47 dB, but the signal between the second input terminal In2 and the output terminal Out only has a signal attenuation by −45.8 dB, indicating that the high frequency signal in the second input terminal In2 still shows that the interferences exist at the output terminal Out. When the first resistance and the fourth resistance are both 5 KΩ, the simulation result of signal attenuation of the high frequency signal between the first input terminal In1 and the output terminal Out and the second input terminal In2 and the output terminal Out shows −0.51 dB and −46.1 dB. When the first resistance and the fourth resistance are both 1 KΩ, the simulation result of signal attenuation of the high frequency signal between the first input terminal In1 and the output terminal Out and the second input terminal In2 and the output terminal Out shows −0.67 dB and −49.5 dB. Optimally, when the first resistance and the fourth resistance are respectively 1 KΩ and 0.1 KΩ, it can be seen that the signal between the first input terminal In1 and the output terminal Out has the minimum attenuation for the signal by −0.48 dB, and the high frequency signal between the second input terminal In2 and the output terminal Out has the maximum attenuation for the signal by −63.2 dB. That is, the attenuations of the high frequency signal can be reduced greatly and the interferences of the high frequency signal can be lowered.

In conclusion, a switch and a multiplexer including the same disclosed in the present invention are configured to dispose the variable resistor in the circuit of the switch, and to adjust the variable resistor corresponding to the switch controlling signal through the resistor controlling signal, such that signal attenuation of the high frequency can be reduced while the switch device is ON and the unnecessary signal, which follows the path passing through the parasitic capacitance between the input terminal and the output terminal and then flows out of the output terminal, can be avoided while the switch device is OFF. The circuit frameworks including the switch and the multiplexer are also disposed with the variable resistors to reduce signal loss and crosstalk caused by the parasitic capacitance of the switch when the signal is transmitted therethrough. That is, attenuations and interferences of the high frequency signals can be avoided synchronously.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A switch being applicable to transmit a high frequency signal from an input terminal to an output terminal therethrough, and the switch comprising:
   a switch device, connected between the input terminal and the output terminal, and comprising a control terminal and configured to be switched between ON and OFF according to a switch controlling signal provided to the control terminal; and
   a variable resistor, connected to the control terminal and configured to be changed to a first resistance while the switch device is ON, and to be changed to a second resistance while the switch device is OFF according to a resistor controlling signal, wherein the first resistance is higher than the second resistance, and the resistor controlling signal is changed corresponding to the switch controlling signal;
   wherein the switch device is a transmission gate consisted of an n-type metal-oxide-semiconductor field effect transistor and a p-type metal-oxide-semiconductor field effect transistor, and the control terminal comprises a gate of the n-type metal-oxide-semiconductor field effect transistor and a gate of the p-type metal-oxide-semiconductor field effect transistor.

2. The switch of claim 1, wherein without the variable resistor and the control of the resistor controlling signal, a frequency of the high frequency signal regards a path passing through a parasitic capacitance between the input terminal and the control terminal as a first conducting path while the switch device is ON, and regards a path passing through the parasitic capacitance between the input terminal and the output terminal as a second conducting path while the switch device is OFF.

3. The switch of claim 2, wherein the first resistance of the variable resistor is higher than an impedance of the parasitic capacitance between the input terminal and the control terminal while the switch device is ON.

4. The switch of claim 2, wherein the second resistance of the variable resistor is smaller than an impedance of the parasitic capacitance between the input terminal and the output terminal while the switch device is OFF.

5. The switch of claim 1, wherein the frequency of the high frequency signal is about 240 MHz.

6. The switch of claim 1, wherein the variable resistor comprises a first variable resistor and a second variable resistor which are respectively connected to the gate of the n-type metal-oxide-semiconductor field effect transistor and the gate of the p-type metal-oxide-semiconductor field effect transistor.

7. The switch of claim 6, wherein the resistor controlling signal comprises a first resistor controlling signal and a second resistor controlling signal which respectively control the first variable resistor and the second variable resistor.

8. The switch of claim 1, wherein the resistor controlling signal is the switch controlling signal.

9. A multiplexer being applicable to transmit a high frequency signal from one of a first input terminal and a second input terminal to an output terminal therethrough, and the multiplexer comprising:
   a first switch device, connected between the first input terminal and the output terminal, and comprising a first control terminal and configured to be switched between ON and OFF according to a first switch controlling signal provided to the first control terminal;
   a second switch device, connected between the second input terminal and the output terminal, and comprising a second control terminal and configured to be switched between ON and OFF according to a second switch controlling signal provided to the second control terminal, wherein ON and OFF of the first switch device and ON and OFF of the second switch device are mutually exclusive;
   a first variable resistor, connected to the first control terminal and configured to be changed to a first resistance while the first switch device is ON, and to be changed to a second resistance while the first switch device is OFF according to a first resistor controlling signal, wherein the first resistance is higher than the second resistance, and the first resistor controlling signal is changed corresponding to the first switch controlling signal; and
   a second variable resistor, connected to the second control terminal and configured to be changed to a third resistance while the second switch device is ON, and to be changed to a fourth resistance while the second switch device is OFF according to a second resistor controlling signal, wherein the third resistance is higher than the fourth resistance, and the second resistor controlling signal is changed corresponding to the second switch controlling signal;

wherein the first switch device is a first transmission gate consisted of a first n-type metal-oxide-semiconductor field effect transistor and a first p-type metal-oxide-semiconductor field effect transistor, and the first control terminal comprises a gate of the first n-type metal-oxide-semiconductor field effect transistor and a gate of the first p-type metal-oxide-semiconductor field effect transistor, and the second switch device is a second transmission gate consisted of a second n-type metal-oxide-semiconductor field effect transistor and a second p-type metal-oxide-semiconductor field effect transistor, and the second control terminal comprises a gate of the second n-type metal-oxide-semiconductor field effect transistor and a gate of the second p-type metal-oxide-semiconductor field effect transistor.

10. The multiplexer of claim 9, wherein without the first and second variable resistors and the control of the first and second resistor controlling signals, a frequency of the high frequency signal regards a path passing through a first parasitic capacitance between the first input terminal and the first control terminal as a first conducting path while the first switch device is ON, and regards a path passing through a third parasitic capacitance between the second input terminal and the second control terminal as a second conducting path while the second switch device is ON, and regards a path passing through a second parasitic capacitance between the first input terminal and the output terminal as a third conducting path while the first switch device is OFF, and regards a path passing through a fourth parasitic capacitance between the second input terminal and the output terminal as a fourth conducting path while the second switch device is OFF.

11. The multiplexer of claim 10, wherein the first resistance is higher than an impedance of the first parasitic capacitance, and the third resistance is higher than an impedance of the third parasitic capacitance.

12. The multiplexer of claim 10, wherein the second resistance is smaller than an impedance of the second parasitic capacitance, and the fourth resistance is smaller than an impedance of the fourth parasitic capacitance.

13. The multiplexer of claim 9, wherein the frequency of the high frequency signal is about 240 MHz.

14. The multiplexer of claim 9, wherein the first variable resistor comprises a third variable resistor and a fourth variable resistor which are respectively connected to the gate of the first n-type metal-oxide-semiconductor field effect transistor and the gate of the first p-type metal-oxide-semiconductor field effect transistor, and the second variable resistor comprises a fifth variable resistor and a sixth variable resistor which are respectively connected to the gate of the second n-type metal-oxide-semiconductor field effect transistor and the gate of the second p-type metal-oxide-semiconductor field effect transistor.

15. The multiplexer of claim 14, wherein the first resistor controlling signal comprises a third resistor controlling signal and a fourth resistor signal which respectively control the third variable resistor and the fourth variable resistor, and the second resistor controlling signal comprises a fifth resistor controlling signal and a sixth resistor signal which respectively control the fifth variable resistor and the sixth variable resistor.

16. The multiplexer of claim 9, wherein the first resistor controlling signal is the first switch controlling signal, and the second resistor controlling signal is the second switch controlling signal.

* * * * *